US005974386A

United States Patent [19]

Ejima et al.

[11] Patent Number: 5,974,386

[45] Date of Patent: Oct. 26, 1999

[54] TIMELINE DISPLAY OF SOUND CHARACTERISTICS WITH THUMBNAIL VIDEO

[75] Inventors: Satoshi Ejima; Toshio Uchikawa, both of Tokyo; Makoto Yamasaki, Chiba, all of Japan

[73] Assignee: Nikon Corporation, Tokyo, Japan

[21] Appl. No.: 08/715,382

[22] Filed: Sep. 12, 1996

[51] Int. Cl.$^6$ .............................. G10L 7/10

[52] U.S. Cl. .............................. 704/276; 704/233; 345/978; 348/185

[58] Field of Search .............................. 345/348, 140, 345/978; 348/185; 396/290, 312; 434/307 R, 307 A; 704/200, 233, 270, 273, 276, 278

[56] References Cited

U.S. PATENT DOCUMENTS

| | | | |
|---|---|---|---|
| 3,439,598 | 4/1969 | Weitzner | 396/312 |
| 3,639,691 | 2/1972 | Beninghof, Jr. | 704/243 |
| 4,015,087 | 3/1977 | Stewart | 704/205 |
| 4,378,466 | 3/1983 | Esser | 345/22 |
| 4,991,032 | 2/1991 | Staffer | 386/66 |
| 5,208,413 | 5/1993 | Tsumura et al. | 434/307 A |
| 5,287,789 | 2/1994 | Zimmerman | 84/477 R |
| 5,297,289 | 3/1994 | Mintzer | 395/800.19 |
| 5,303,327 | 4/1994 | Sturner et al. | 704/270 |
| 5,566,134 | 10/1996 | Dufault | 367/135 |
| 5,583,652 | 12/1996 | Ware | 386/75 |
| 5,878,292 | 3/1999 | Bell et al. | 396/312 |

OTHER PUBLICATIONS

Thomas W. Parsons, "Voice and Speech Processing," McGraw–Hill, Inc., New–York, 1987, pp. 257–259.

*Primary Examiner*—David R. Hudspeth
*Assistant Examiner*—Donald L. Storm

[57] ABSTRACT

A sound processing apparatus is provided with a sound information input device, a recording device to record the sound information, a converting device to convert the sound information into image information, and a display device to display the image information, the display device being such that the vertical and horizontal directions of the display device are time axes and the unit of one of the time axes is longer than the unit of the other time axis. The image information displayed on the display device can be selected by a selection device to display the sound information. The sound information can also be displayed as image information corresponding to a frequency component of the sound information within a predetermined time. The frequency component may be detected using discrete cosine transformation (DCT) for compressing the sound information.

32 Claims, 7 Drawing Sheets

TIMELINE DISPLAY OF SOUND CHARACTERISTICS WITH THUMBNAIL VIDEO

BACKGROUND OF THE INVENTION

1. Field of the Invention

This invention relates to a sound processing apparatus.

2. Related Background Art

There are known tape recorders for recording and reproducing sound and sound recording electronic cameras or the like capable of recording and reproducing both of sound and images.

Such an apparatus is provided with a so-called counter and has been designed such that the display by the counter changes with the lapse of time or the running of a tape.

In such a sound processing apparatus, when sound is to be reproduced, it has been necessary to look for the location of desired sound with the display by the counter as a standard. When the desired sound is not found out, it has been necessary to rapidly feed or rewind the tape and look for the sound by the help of the counter and the sixth sense, and it has been very difficult to operate such apparatus.

Also, there has been software displaying sound information in personal computers or the like, but some of the software is merely the above-described sound processing apparatus as it has been simulated by software and the operability of the apparatus has never been particularly improved.

Also, in another set of software, an oscilloscope is simulated in the fashion of software, and there has been one which displays sound as a waveform. It has been possible to select a portion of which the sound reproduction is desired on a monitor by selecting means.

However, even when the kind of the sound which is the object of recording changes as when for example, the speaker changes, a similar waveform is displayed and it has been impossible to recognize more or less difference in the waveform with the naked eye and pressure the generation source of the sound. Accordingly, there have been required trial and error such as reproducing the sound and further reproducing this side or that side thereof from that situation and thus, the convenience of use has been bad.

Also, in a sound processing apparatus of this kind, sound is generally represented as a graph on a monitor, and the vertical direction has been a sound pressure axis representative of the strength of waveform and the horizontal direction has been a time axis representative of time. Therefore, when an attempt is made to display sound recorded for a long time at once, it has been necessary to reduce the whole as by changing the axis of abscissas of the graph, for example, from five seconds to one minute per 1 cm. If this is done, there has arisen the problem that when there is sound uttered for a short time in a portion thereof, the graph representative of this sound of short time becomes small and becomes unrecognizable.

SUMMARY OF THE INVENTION

It is an object of the present invention to provide a sound processing apparatus which can quickly effect the retrieval of desired sound information.

To achieve the above object, according to a first aspect of the present invention, there is provided a sound processing apparatus provided with sound information input means, recording means for recording the sound information, converting means for converting the sound information into image information, and display means for displaying the image information, the display means being such that the vertical and horizontal directions of the display means are time axes and the unit of one of the time axes is longer than the unit of the other time axis.

According to a second aspect of the present invention, there is provided a sound processing apparatus provided with sound information input means, recording means for recording the sound information, converting means for converting the sound information into image information, display means for displaying the image information, and frequency detecting means for detecting a sound-free portion in which there is no sound of a predetermined level or higher for a predetermined time or longer, wherein first image information made from sound information recorded before the sound-free portion detected by the frequency detecting means and image information made from sound information recorded after the sound-free portion are separated from each other and displayed on the display means.

According to a third aspect of the present invention, there is provided a sound processing apparatus provided with sound information input means, recording means for recording the sound information, converting means for converting the sound information into image information, display means for displaying the image information, and sound-free portion detecting means for detecting a sound-free portion in which there is no sound of a predetermined level or higher for a predetermined time or longer, wherein the image information differs between the sound-free portion and a non-sound-free portion.

According to a fourth aspect of the present invention, there is provided a sound processing apparatus provided with sound information input means, recording means for recording the sound information, display means, frequency detecting means for detecting the frequency component of the sound information within a predetermined time, and converting means for converting the sound information into image information corresponding to the frequency component, wherein the image information is displayed on the display means.

According to a fifth aspect of the present invention, there is provided a sound processing apparatus provided with sound information input means, recording means for recording the sound information, display means, frequency detecting means for detecting the frequency component of the sound information within a predetermined time, and converting means for converting the sound information into image information, wherein when the difference between the frequency component of first sound information recorded with the lapse of time and the frequency component of second sound information recorded thereafter is a predetermined value or greater, image information made from the first sound information and image information made from the second sound information are separated from each other and displayed.

According to a sixth embodiment of the present invention, there is provided a sound processing apparatus provided with sound information input means, recording means for recording the sound information, display means for displaying image information, frequency detecting means for detecting the frequency component of the sound information within a predetermined time, and converting means for converting the sound information into image information corresponding to the frequency component, wherein when the difference between the frequency component of first sound information recorded with the lapse of time and the frequency component of second sound information recorded thereafter is a predetermined value or greater, image information made from the first second information and image information made from the second sound information are separated from each other and displayed.

According to a seventh aspect of the present invention, there is provided a sound processing apparatus provided with sound information input means, recording means for recording the sound information, display means, frequency detecting means for detecting the frequency component of the sound information within a predetermined time, sound-free portion detecting means for detecting a sound-free portion in which there is no sound of a predetermined level or higher for a predetermined time or longer, and converting means for converting the sound information into image information, wherein when the difference between the frequency component of first sound information recorded with the lapse of time and the frequency component of second sound information recorded thereafter is a predetermined value or greater, and when the sound-free portion is detected between the first sound information and the second sound information by the frequency detecting means, image information made from the first sound information and image information made from the second sound information are separated from each other and displayed.

According to an eighth aspect of the present invention, there is provided a sound processing apparatus provided with sound information input means, recording means for recording the sound information, frequency detecting means for detecting the frequency component of the sound information within a predetermined time, and output means for outputting sound information including a predetermined frequency component from among a plurality of bits of sound information.

According to a ninth aspect of the present invention, there is provided a sound processing apparatus provided with sound information input means, recording means for recording the sound information, display means, converting means for converting the sound information into image information, and frequency detecting means for detecting the frequency component of the sound information within a predetermined time, wherein only image information made from one of a plurality of bits of sound information of which the frequency component is within a predetermined value is displayed.

According to a tenth aspect of the present invention, there is provided a sound processing apparatus provided with sound information input means, sound recording means for recording the sound information, display means, frequency detecting means for detecting the frequency component to the sound information within a predetermined time, converting means for converting the sound information into first image information corresponding to the frequency component, image pickup means for converting an object image into second image information, compressing means for compressing the second image information by the use of discrete cosine transformation, and image recording means for recording the compressed information, wherein said frequency detecting means uses the discrete cosine transformation.

According to an eleventh aspect of the present invention, there is provided a sound processing apparatus provided with image reproducing means for reproducing image information, and sound reproducing means for reproducing sound information corresponding to the image information, wherein the image information is displayed for a time necessary to reproduce the sound information corresponding to the image information.

The above and other objects, features and advantages of the present invention will be explained hereinafter and may be better understood by reference to the drawings and the descriptive matter which follows.

DESCRIPTION OF THE PREFERRED EMBODIMENTS

Figure 1A:
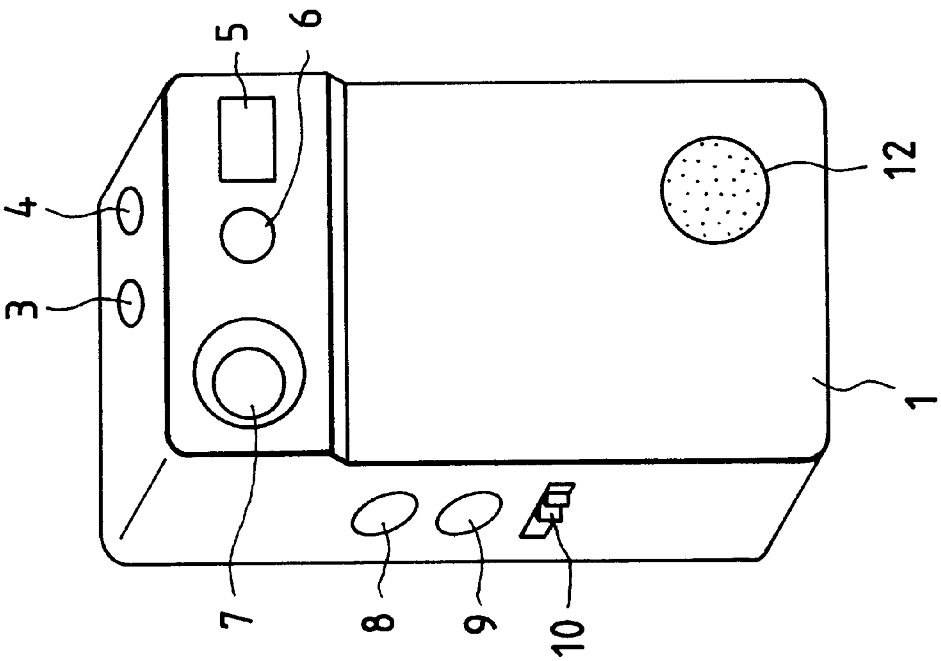
FIGS. 1A and 1B are schematic views of a sound processing apparatus according to the present invention.
Figure 1B:
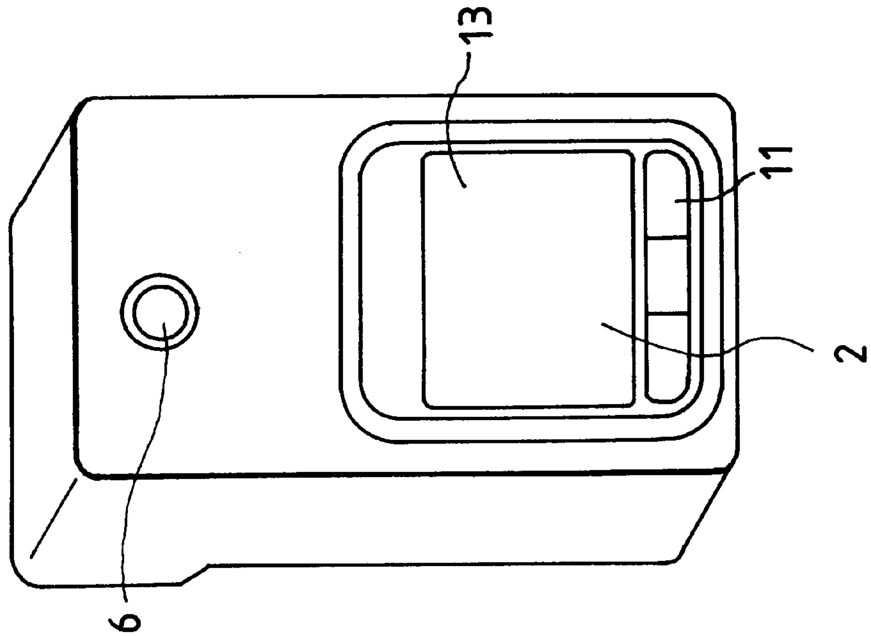

FIGS. 1A and 1B are schematic views of an electronic camera apparatus according to the present invention. The electronic camera apparatus 1 is provided with a power source switch 10 and a liquid crystal display (hereinafter referred to as the LCD, the size of which is 6 cm×4 cm) 2 for displaying the reproduction of a still image and various kinds of data. A stroboscopic lamp 5, a finder 6, a phototaking lens 7 and a release button 8 are concerned in the recording of an image, and a microphone 3, an earphone jack 4, a recording button 9 and a speaker 12 are concerned in the recording and reproduction of sound. A switch button 11 is a switch for a user to effect various settings. Also, on the surface of the LCD 2, there is provided a so-called touch tablet 13 which, when touched by a pen-like indicating member, can input an indicated position. This touch tablet 13 is formed of transparent resin and the LCD 2 inside thereof can be observed through the touch tablet 13.

Figure 2:
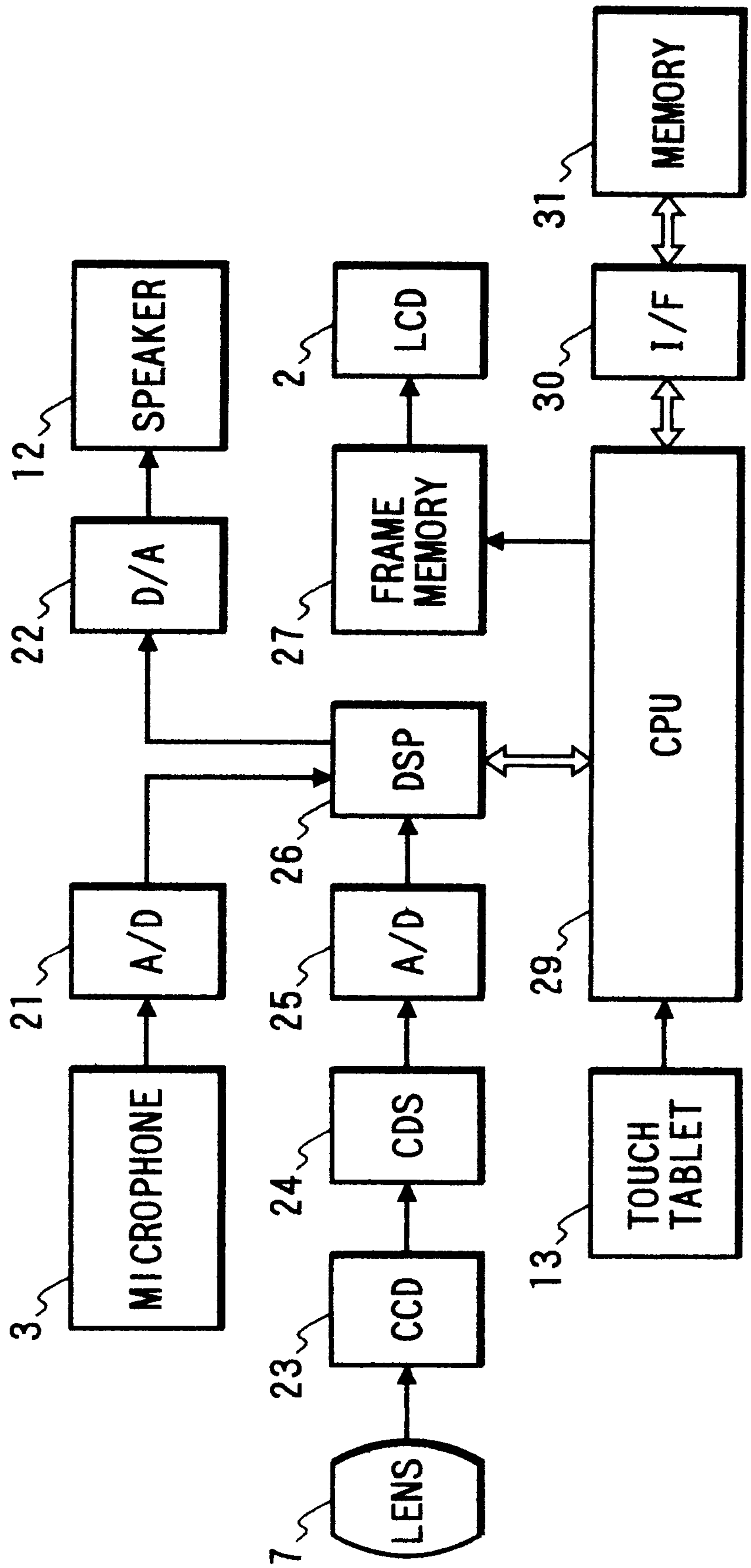
FIG. 2 is a circuit block diagram of the sound processing apparatus according to the present invention.

FIG. 2 is a circuit block diagram. Sound is inputted from the microphone 3, is converted into digital data by an A/D converting circuit 21, and is inputted to a digital signal processor 26 (shown as DSP in the figure). The digitized sound signal is compressed in the digital signal processor 26, and is recorded in a memory 31 via a CPU 29 and an interface 30.

This compression of the sound is effected by effecting discrete cosine conversion, and then quantizing the sound and Huffman-coding it. As will be described later, this makes it possible to effect the analysis of a frequency by the use of the result of the discrete cosine conversion. The compression of the sound may be effected not by the use of such a compressing method, but by the use of a compressing system using discrete cosine conversion for the compression of image information (for example, the JPEG compressing system), and this discrete cosine conversion means may be used for the analysis of the frequency of sound information.

The image will now be described.

As regards an object image, a light beam condensed by the photo-taking lens 7 is imaged on a CCD 23 which is an image pickup device. The photoelectrically converted image information is converted into digital data by an A/D converter 25 via a correlative dual sampling circuit (shown as CDS in the figure) 24. The digital data is compressed by the digital signal processor 26 and is accumulated in the memory 31 via the CPU 29 and the interface 30. Here, the compression effected is the JPEG compressing system comprising a combination of discrete cosine transformation, quantization and Huffman coding.

The information compressed and accumulated in the memory 31 can be displayed on the LCD 2 provided on the back of the apparatus 1. The information in the memory 31 is read by the CPU 29 via the interface 30, is stretched by the digital signal processor 26, again passes through the CPU 29 and is once stored in a frame memory 27, and then is displayed on the LCD 2. Here, in the case of image information, stretched image data is stored as a bit map in the frame memory and is displayed. Further, as required, the bit map data is sent as a thinned and reduced so-called thumbnail image to the frame memory 27 and is displayed by the LCD 2.

On the other hand, when sound information is to be reproduced, the bit map data stretched by the digital signal processor 26 and resulting from sound having been visualized is sent so as to be displayed as a bar graph as will be described later, and is displayed.

Also, a timepiece circuit for knowing date and time is contained in the CPU 29, and the date and time when the sound information and the image information are recorded can be recorded with the sound information and the image information.

Figure 3:
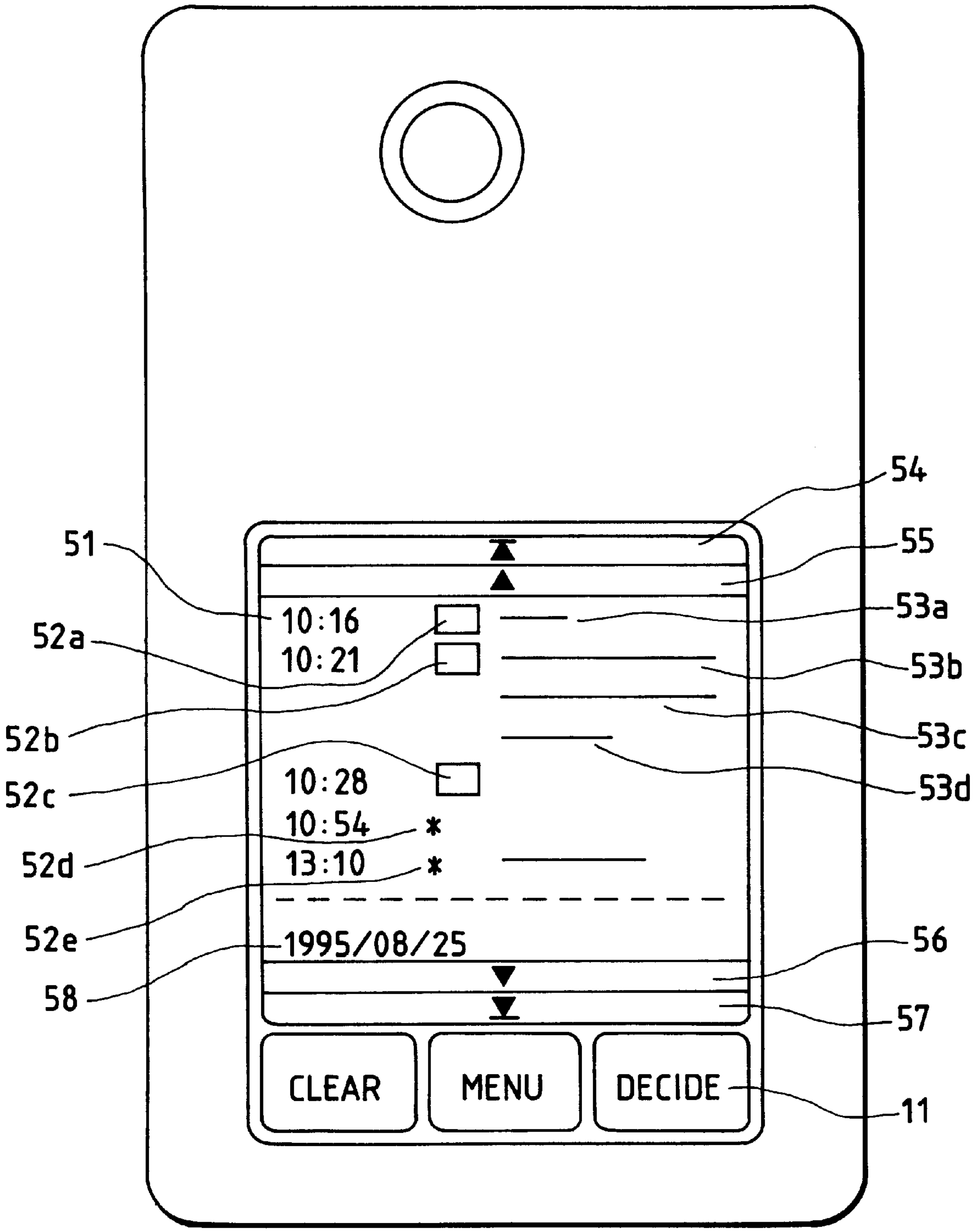
FIG. 3 is a schematic view of the display unit of the sound processing apparatus of the present invention.

FIG. 3 shows the substance displayed by the LCD 2. This display is a screen after image photographing and sound recording have already been completed and when the information thereof is reproduced.

On this display screen, the sound information is visualized and is displayed as a bar graph 53*a*. The bar graph when the recorded sound is short is displayed short. Also, when a time which can be regarded as a sound-free state in which the sound is smaller than a predetermined volume is present for a predetermined time or when the frequency band of sound (for example, a man's voice and a woman's voice, or the sound of a background such as a little stream and man's voice) has changed, it is displayed as a bar graph 53*b* with the display of the bar graph lowered by one stage. Further, the display of the bar graphs 53*a* and 53*b* is effected in colors corresponding to the frequencies of the sounds by a method which will be described later.

From this, a user can see by looking at the bar graphs 53*a* and 53*b* that the recorded substance of conversation has changed or the speaker has changed, and this makes the standard when the sound is reproduced later. The above-mentioned sound-free state will hereinafter be referred to as the sound-free portion.

When the same continuous sound is recorded for a long time (e.g. 2 minutes and 30 seconds), information recorded for a predetermined time (e.g. one minute) is displayed as a bar graph 53*b* (corresponding to one minute), and is further displayed as a bar graph 53*c* (corresponding to one minute) on a new line, and further in this case, is displayed as a bar graph 53*d* (corresponding to 30 seconds).

As described above, the axis of abscissas of the display is used as a time axis in which the longest bar graph is one minute and the axis of ordinates is used as a time axis in which one line is one minute, whereby long sound information, i.e., the bar graphs 53*b*, 53*c* and 53*d* and short sound information 53*a* can be recognized at a time.

This display of the sound information is not limited to bar graphs, but for example, a plurality of marks "*" may be arranged side by side in conformity with the recording time. Also, the marks may be changed or the pattern of the bar graphs may be changed corresponding to the frequency of sound.

The time 51 during sound recording is displayed at the left of the bar graph. The display of this sound recording time may be that at the start or the end of the sound recording, or the average value at the start and end of the sound recording. Further, the recording time may be displayed laterally of or below the sound recording time.

Design is made such that when the date of recording has changed, date information 58 is displayed. By this, when information recorded on a later date is to be reproduced, it becomes possible to quickly look for a desired portion to be reproduced.

The reference character 52*a* designates a so-called thumbnail image in which photographed image information is displayed small, and this is displayed laterally of sound information when it is recorded simultaneously with sound. When image information alone is recorded and sound information is not recorded, the image information alone is displayed as indicated at 52*c*. Also, when it is difficult in terms of the processing capability of the CPU 29 to reduce and display the image information, for example, a mark "*" may replace as indicated at 52*d* and 52*e*.

The detection of the sound-free portion will now be described with reference to FIG. 4.

Figure 6:
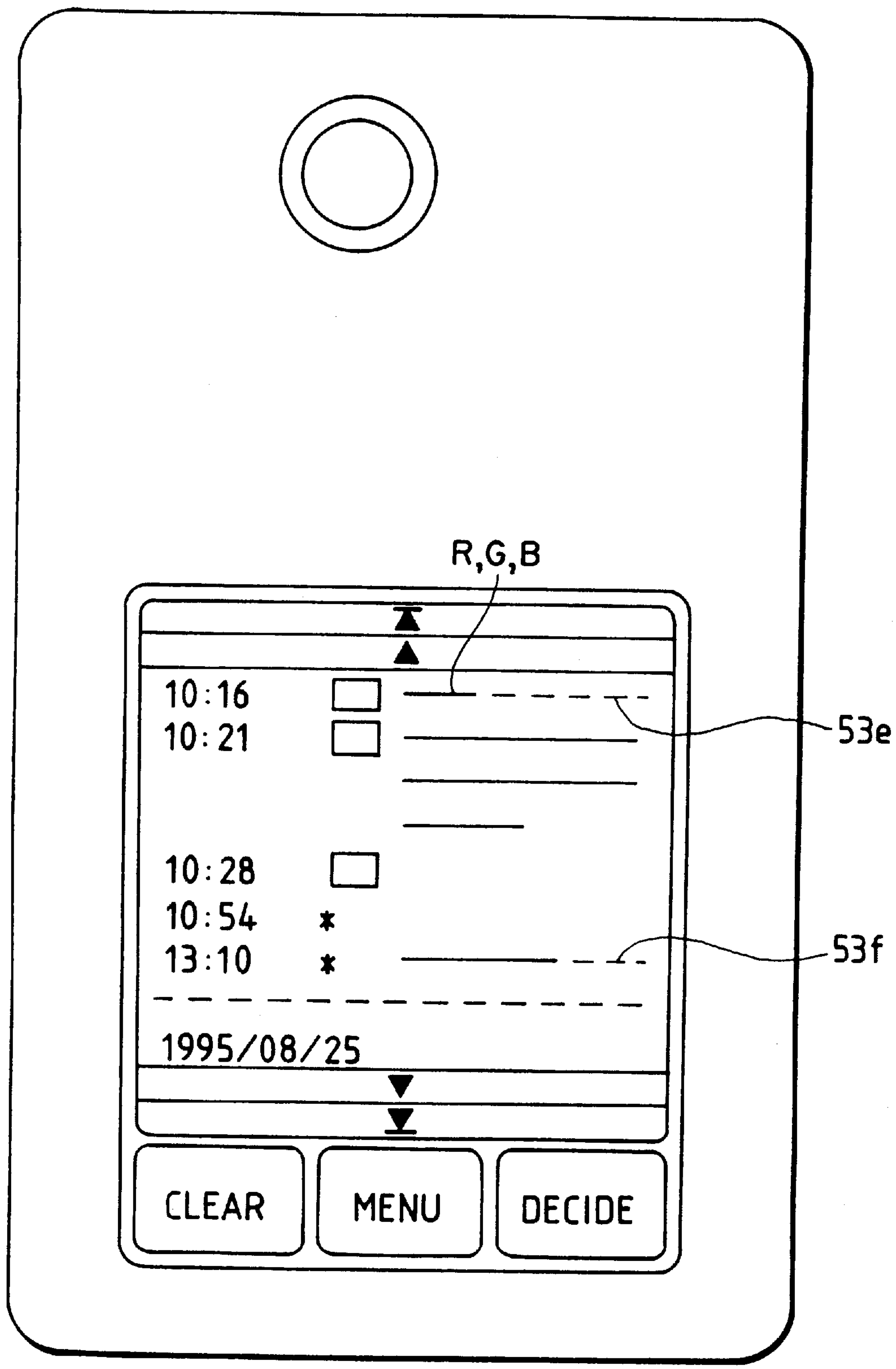
FIG. 6 shows the display on the display unit of the sound processing apparatus of the present invention in which sound-free portions are represented with dotted lines or colors changed as at 53*e* and 53*f*.
Figure 7:
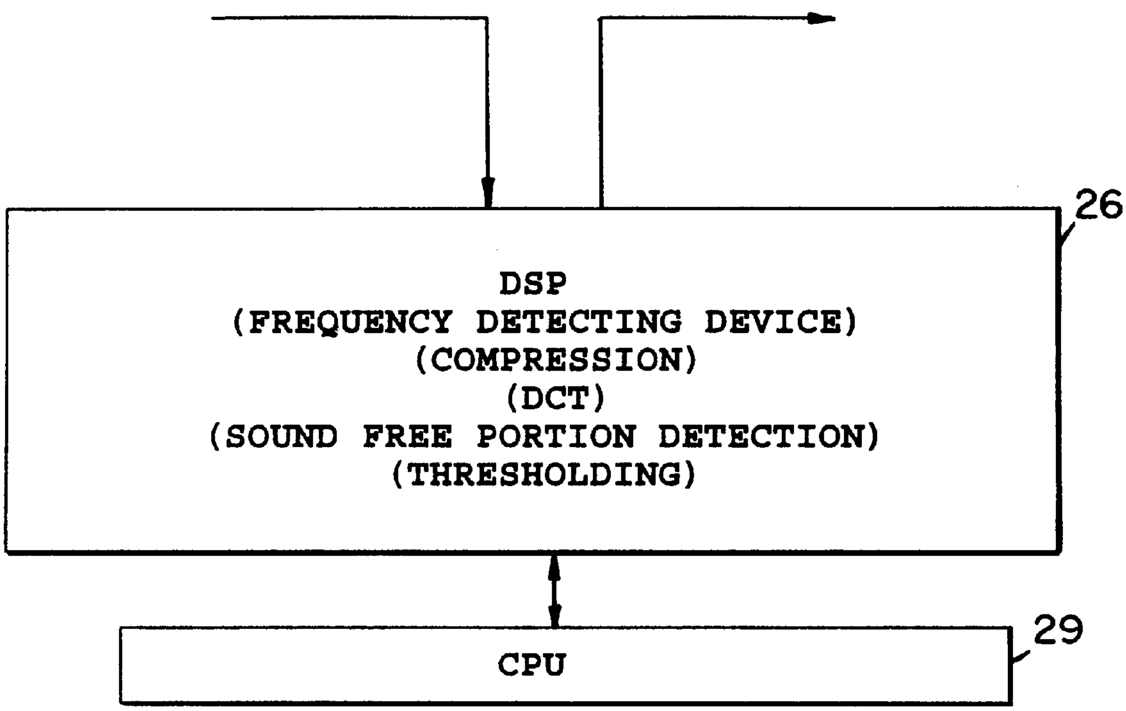
FIG. 7 is a block diagram illustrating in detail the operations performed by the digital signal processor (DSP) shown in FIG. 2 according to the present invention.

The waveform 40 of sound can be divided broadly into a sound having portion 41, a sound-free portion 42 and a sound-free portion 43. Here, waveforms of a predetermined amplitude or less are defined as the sound-free portions, and the magnitude P of the amplitude recognized as the sound-free portions can be selected by the user. As represented by $\Delta t$ in FIG. 4, generally man's voice include very short sound-free portions as when consonants have been pronounced. So, design is made such that only sound-free portions of a predetermined line or longer are recognized so that such sound-free portions may not be detected. The lengths of these sound-free portions can be selected between about 0.3 sec. and about 1 sec. by the user. As previously described, only the sound-free portion 42 smaller than a predetermined amplitude and longer than a predetermined time is recognized and the bar graph thereof is displayed in a new line. Also, by mode setting means, not shown, it is possible to display the sound-free portions with dotted lines or colors changed as indicated at 53*e* and 53*f* in FIG. 6. By this, the presence of the sound-free portions and the lengths of the sound-free portions can be visually recognized.

Besides this, the sound-free portions may be displayed by the use of a special mark representative of being free of sound, for example, a pause in musical notes or the like. Further, sound data in which a sound-free portion has once been found out may be again recorded in the memory with a special code put into the sound-free portion. In this case, there is the advantage that when the bar graph of sound is to be again displayed, the process of looking for the sound-free portion becomes simple and the display speed of the bar graph is improved. Also, besides the display in which the bar graph is lowered by one stage in the sound-free portion, provision may be made of a mode in which the sound-free portion is also displayed as a bar graph and a mode in which the sound-free portion is not displayed.

The detection of the frequency of sound will now be described.

The present apparatus incorporates hardware for compressing image information and sound information in the digital signal processor. Now, generally in the compression, discrete cosine transformation (DCT), quantization and two-dimensional Huffman coding are effected. DCT is not restricted to hardware, but may be carried out by software.

Here, when the inputted data x are eight, DCT is represented by the transformation of mathematical expression 1.

$$\begin{bmatrix} y0 \\ y1 \\ \vdots \\ y7 \end{bmatrix} = \begin{bmatrix} d0,0\ d0,1 \ldots d0,7 \\ d1,0\ d1,1 \ldots d1,7 \\ \vdots \\ d7,0\ d7,1 \ldots d7,7 \end{bmatrix} * \begin{bmatrix} x0 \\ x1 \\ \vdots \\ x7 \end{bmatrix}$$

$$d0, m = 1/\sqrt{M}$$

$$(m = 0, 1, 2, \ldots 7)\ M = 8$$

$$dk, m = \sqrt{\frac{2}{M}} \cos\frac{(2m+1)k\pi}{2M}$$

$$\begin{pmatrix} k = 1, 2, \ldots, 7 \\ m = 0, 1, 2, \ldots, 7 \end{pmatrix}$$

Here, sound data are put into x0–x7, whereby values corresponding to different frequencies can be obtained in y0–y7. While the data are eight here, the data may be sixteen.

Now, assuming that sampling data are eight and sampling frequency is 1 KHz, there are obtained 125 sets of values of y0–y7 within a second. When these values are averaged for each of y0–y7, the fluctuation of frequency by the utterance of each sound, i.e., "a" or "i", is averaged and there is obtained a value conforming to the frequency of the utterer's voice. When the change in the value of y at each one second has become greater than a predetermined value, it is judged that the utterer has changed or the utterer has stopped utterance and only the noise behind him or her has been recorded, and a bar graph is displayed in a new line.

Further, when a bar graph is to be displayed in a mixture of colors R, G and B, the size of R is determined as a function of the values of y0, y1 and y2, and the size of G is determined from y3, y4 and y5, and the level of B is determined from the sizes of y6 and y7. Specifically, each value of y assumes a value of 0 to 255 and therefore, calculation is made as R=(y0×65536+y1×256+y2)÷65536

G=(y3×65536+y4×256+y5)÷65536

B=(y6×256+y7)/256.

Here, B alone has been calculated from two y's, whereas the calculation is not restricted to B, but may be R or G.

By this, it is possible to analyze the frequency of sound by the utilization of the DCT used in the compression, and start a new line and classify the bar graphs by color and therefore, it is possible to effect the retrieval of the user's voice quickly and software or hardware for the analysis of the frequency need not be newly prepared and thus, a decrease in cost becomes possible and the efficiency of processing is improved.

The predetermined time for averaging the frequency is not limited to one second, but yet when there is short utterance such as an agreeable response, the possibility that it cannot be detected becomes greater as the time becomes longer. Also, if the predetermined time is too short, there is the possibility that the user is captured by each sound in a pronunciation and therefore, it is experimentally desirable that the predetermined time be 0.3 second or longer. By this, the length and frequency of sound man can recognize as at least voice are detected, whereby it becomes possible to discriminate between the voices of a plurality of persons or between man's voice and noise or the like. Also, if for example, the difference between the frequency averaged during one second and the frequency averaged during the next one second is equal to or less than a predetermined value, display is effected in the same color as an error by the same person's pronunciation.

When among the bar graphs classified by color as described above, a bar graph of a particular color is touched twice from above the touch tablet 13 by an indicating member, only that bar graph of the particular color is displayed and the bar graphs of the other colors becomes temporarily extinct from the display screen. By this, it becomes possible to select only the sound of a particular speaker or a sound producing member. When the switch button 11 is depressed, only the sound of a particular frequency corresponding to the bar graph of the selected particular color is reproduced. By this, it becomes possible to reproduce only a particular speaker's sound.

Further, when the frequency varies periodically variously, the possibility of music having been recorded is high and therefore, it is possible to display the mark of a musical note at the left end of a bar graph and also display the bar graph in a color differing from the others.

Description will now be made of a method of reproducing sound and image information.

Only the bar graph 53*a* in the display of FIG. 3 is touched by a pen-like indicating member, not shown, and the switch button 11 is depressed, whereupon only the sound corresponding to the bar graph 53*a* is reproduced.

Also, the bar graphs 53*a* and 53*b* are continuously touched by the indicating member and the switch button 11 is depressed, whereupon the sounds corresponding to the bar graphs 53*a* and 53*b* are reproduced. Also, when a switch 56 is depressed, the display scrolls downwardly and when a switch 57 is depressed, the display scrolls to the last. Likewise, when switches 54 and 55 are depressed, the display scrolls upwardly and to the beginning. By this, it becomes possible to select a bar graph in any range.

On the other hand, the image thumbnail 52*a* is selected by the indicating member and the switch button 11 is depressed, whereupon the image is enlarged and displayed large on the LCD 2. When the switch 55 is depressed, the image just preceding it is reproduced, and when the switch 56 is depressed, the image just succeeding it is reproduced, and when the switch 54 is depressed, the image photographed at first is displayed, and when the switch 57 is depressed, the image photographed lastly is displayed.

Also, when the image thumbnails 52*a*, 52*b*, 52*c* and 52*d* are continuously selected, four images are displayed on the LCD 2 while being enlarged to a size with which they can be displayed at a time. In a manner similar to that previously described, they scroll in response to the operation of the switches 54–57. When one of the images divided into four is touched by the indicating member, that image is enlarged and displayed.

Next, when the indicating member is obliquely moved and its lateral movement range moves in a range including images and sound, images and sound included in the vertical movement range of the indicating member are displayed and reproduced. That is, it is possible to quickly discriminate and select the sound information on the basis of the image information. At this time, the images are also successively displayed with the lapse of the time of the sound. That is, the image corresponding to the thumbnail 52*a* is displayed for a time during which the sound represented by the bar graph 53*a* of sound is reproduced. Next, the image corresponding to the thumbnail 52*b* is displayed for a time during which the sounds represented by the bar graphs 53*b*, 53*c* and 53*d* of sound are reproduced. Also, design is made such that a thumbnail free of sound like the thumbnail 52*c* is reproduced for a predetermined time, i.e., about three seconds.

Figure 5:
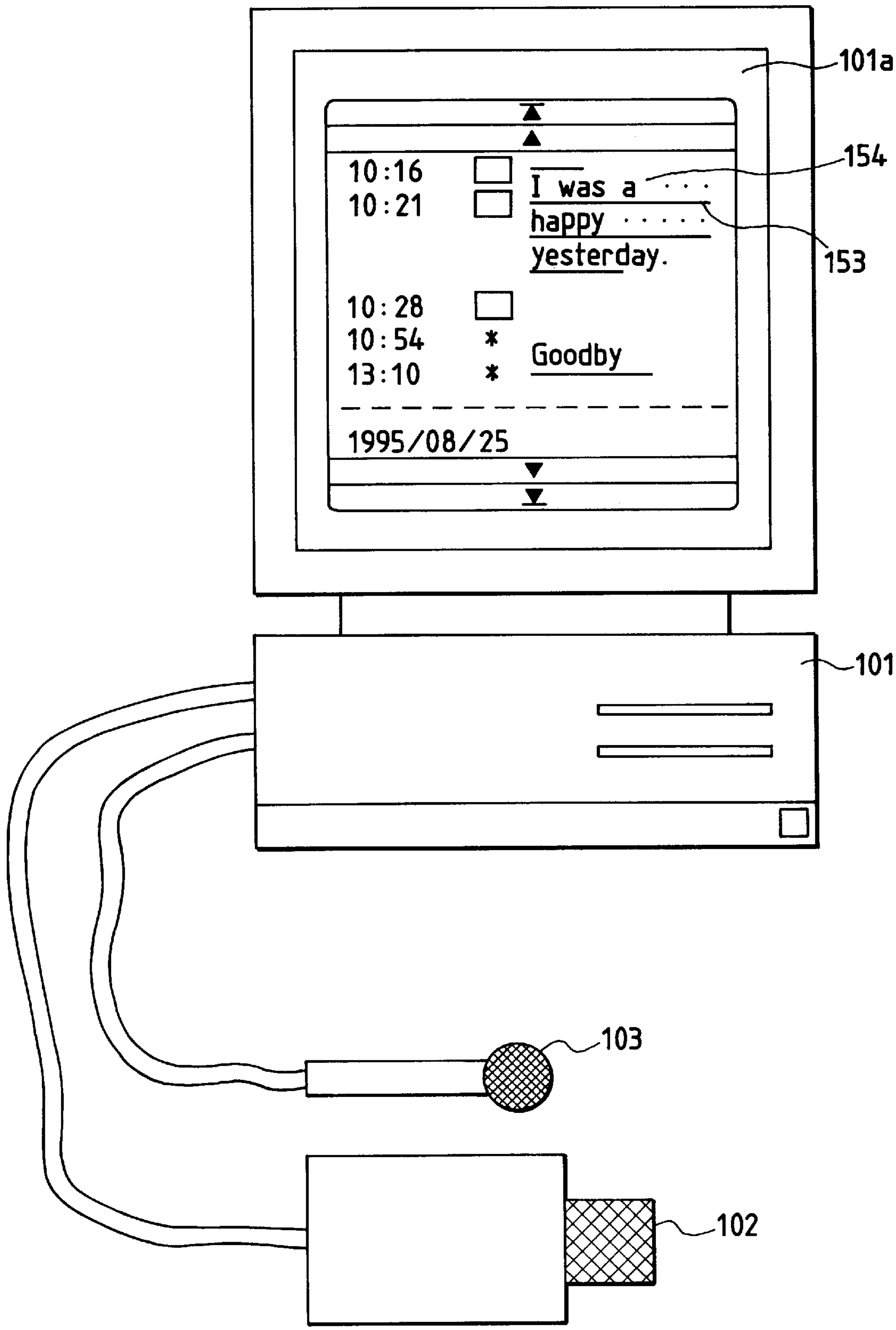
FIG. 5 shows the display by a personal computer.

FIG. 5 shows an embodiment in which the present invention is carried out in a personal computer.

In FIG. 5, a CCD camera 102 is connected to the personal computer 101 through a code, and a microphone 103 is also connected thereto.

Instead of the CCD camera 102 and the microphone 103, the apparatus 1 of FIGS. 1A and 1B provided with a camera function and a microphone may be connected to the personal computer 101, and the information recorded in the memory 31 by the apparatus 1 may be transmitted to the personal computer 101 through a cord or a recording medium.

A screen similar to that of FIG. 3 is displayed on the screen 101*a* of the personal computer, and an operation similar to that previously described is possible by the use of an indicating member such as a mouse. However, what corresponds to the switch button 11 is operable from the keyboard of the personal computer and is therefore omitted.

Also, reproduced sound the user has heard can be inputted as character information 154 onto a bar graph 153 by the utilization of the word processor function.

A plurality of image thumbnails 152 and a plurality of bits of character information 154 can be copied at a time onto other application software such as word processor software. Also, when a bar graph is reproduced and there is a pronunciation "yesterday" in it, a bar graph in that range is designated as a range and a retrieval button, not shown, is depressed, whereby it is possible to retrieve the pronunciation "yesterday" from all sound information recorded. When the character information "yesterday" is written on the bar graph by the user, it is possible to automatically dispose the character "yesterday" on the pronunciation "yesterday" found out by the retrieval.

Figure 4:
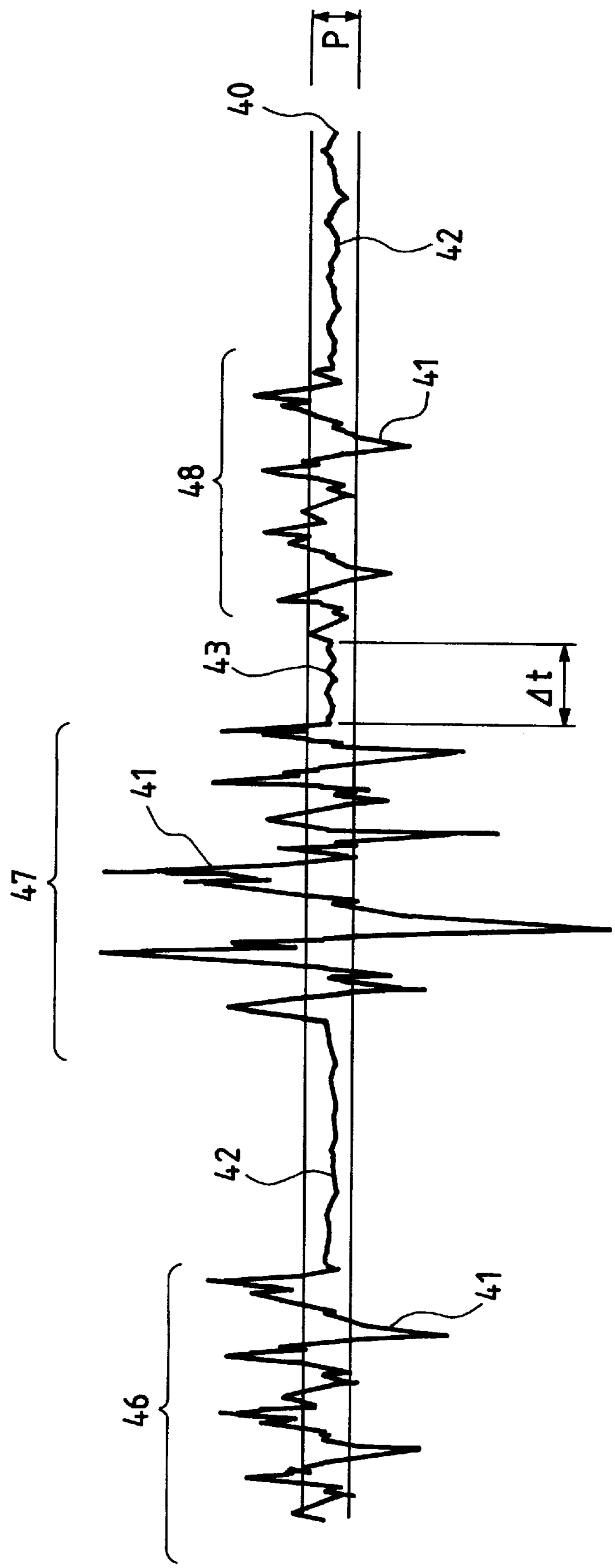
FIG. 4 is a graph of a sound raw waveform and a raw waveform.

This retrieval of sound is such that as shown in FIG. 4, a sound waveform before and after and similar to a sound waveform 46 desired by the user is looked for and a waveform of signal approximate to, though more or less differing in amplitude from a waveform of signal like a sound waveform 48 is found out.

When finding this correlation, there are:

1. A method of frequency-analyzing the sound waveform 46 and regarding it as being good if the analyzed sound spectrum and a sound spectrum resulting from the other ranges having been frequency-analyzed are approximate to each other by 90% or more; and 2. A method of calculating the correlations of the sound waveform 46 to the sound waveform 47 and the sound waveform 48, and displaying a waveform of higher correlation. By these methods there is the possibility that for example, "yesterday" when rapidly pronounced cannot be retrieved, but there is no problem because it will do if it becomes strictly the standard when the user reproduces sound.

As described above, in the first aspect of the present invention, with the lapse of recording time, sound information is converted into image information, for example, laterally from the left to the right and is displayed, and when a predetermined time elapses, the display position moves to a position lower by one stage in the same manner as the previous image information and the image information is displayed.

By this, in contrast with the example of the prior art in which the time axis has been only the axis of abscissas, it has become possible to use the area of the monitor effectively. As a result, even if information recorded for a long time and information recorded for a short time are displayed at a time, it has become possible to observe the whole without reducing it.

Also, in the second aspect of the present invention, design is made such that first image information made from sound information recorded before the sound-free portion detected by the frequency detecting means and image information made from sound information recorded after the sound-free portion are separated from each other and displayed on the display means. By this, when man's conversation has been recorded, the display position changes in a sound-free portion wherein the speaker has changed or the substance of the speaker's conversation has changed and therefore, the user becomes able to imagine the recorded substance while looking at the display means, and it has become possible to quickly find out any desired portion to be reproduced.

In the third aspect of the present invention, image information differs between the sound-free portion and the non-sound-free portion, whereby the user can visually recognize portions in which there is sound and besides, portions in which there is no sound and the lengths thereof are made recognizable and therefore, it has become possible to quickly find out any desired portion to be reproduced.

In the fourth aspect of the present invention, when the frequency has changed, the color or shape of image information corresponding to the frequency is changed, whereby the discrimination between a portion in which the speaker's conversation is recorded and a portion in which the speaker does not speak and noise is recorded has become visually possible. Further, the change of the speaker and a change in the frequency of the speaker's voice have become recognizable, and it has become possible to quickly find out any desired portion to be reproduced.

In the fifth aspect of the present invention, when the frequency has changed, the display position is changed, whereby any change in the speaker's conversation and any change of the speaker have become visually recognizable, and it has become possible to quickly find out any desired portion to be reproduced.

In the sixth aspect of the present invention, when the frequency has changed, the display position is changed and the color or shape of image information representative of sound is changed correspondingly to the frequency, whereby further any change in the speaker's conversation and the change of the speaker have become visually recognizable, and it has become possible to quickly find out any desired portion to be reproduced.

In the seventh aspect of the present invention, when a sound-free portion and any change in the frequency have been detected, the display position is changed, whereby any change in the speaker's conversation and the change of the speaker have become visually recognizable, and it has become possible to quickly find out any desired portion to be reproduced.

In the eighth aspect of the present invention, design is made to have output means for outputting sound information including a predetermined frequency component, from among a plurality of bits of sound information, whereby it has become possible to reproduce the sound when, for example, a particular speaker is uttering.

In the ninth aspect of the present invention, design is made to have output means for outputting sound information including a predetermined frequency component, from among a plurality of bits of sound information, whereby it has become possible to display on the display means only the sound uttered, for example, by a particular speaker.

In the tenth aspect of the present invention, the frequency component of sound is detected by the utilization of discrete cosine transformation used in the compression of an image to thereby detect the frequency of the sound and therefore, any new software or hardware need not be added.

In the eleventh aspect of the present invention, image information is displayed for a time necessary to reproduce sound information corresponding to the image information and therefore, natural reproduction of sound and image has become possible.

Having described preferred embodiments of the present invention, it is to be understood that any variations will occur to those skilled in the art within the scope of the appended claims.

What is claimed is:

1. A sound processing apparatus comprising a sound information input device, a recording device to record said sound information, a converting device to convert said sound information into image information, and a display device to display said image information, said display device being such that the vertical and horizontal directions of said display device are time axes and the unit of one of the time axes is longer than the unit of the other time axis.

2. The sound processing apparatus of claim 1, further comprising a selecting device to select the image information displayed on said display device, whereby the sound information can be selected.

3. The sound processing apparatus of claim 1, further comprising a time measuring device and wherein said time is recorded in said recording device, and said image information and said time are displayed on said display device.

4. The sound processing apparatus of claim 1, further comprising:

a sound free portion detecting device to detect a sound-free portion in which there is no sound of a predetermined level or higher for a predetermined time or longer, wherein first image information made from said sound information recorded before the sound-free portion detected by said frequency detecting device and image information made from said sound information recorded after the sound-free portion are separated from each other by starting a new line and displayed on said display device.

5. The sound processing apparatus of claim 4, further comprising a selecting device and wherein the image information displayed on said display device is selected, whereby the sound information can be selected.

6. The sound processing apparatus of claim 4, further comprising a time measuring device and wherein said time is recorded in said recording device, and said image information and said time are displayed on said display device.

7. The sound processing apparatus of claim 1, further comprising:

a frequency detecting device to detect the frequency component of said sound information within a predetermined time, and a converting device to convert said sound information into image information corresponding to said frequency component, wherein said image information is displayed on said display device in colors set in correspondence with a frequency.

8. The sound processing apparatus of claim 7, further comprising a selecting device and wherein the image information displayed on said display device is selected, whereby the sound information can be selected.

9. The sound processing apparatus of claim 7, wherein the predetermined time for detecting the frequency component is at least 0.3 second.

10. sound processing apparatus of claim 7, further comprising a compressing device using a discrete cosine transformation device to compress the sound information and wherein said discrete cosine transformation device is used as said frequency detecting device.

11. The sound processing apparatus of claim 7, further comprising a time measuring device and wherein said time is recorded in said recording device and said image information and said time are displayed on said display device.

12. The sound processing apparatus of claim 1, further comprising:

a frequency detecting device to detect the frequency component of said sound information within a predetermined time, wherein when the difference between the frequency component of first sound information recorded with the lapse of time and the frequency component of second sound information recorded thereafter is a predetermined value or greater, image information made from said first sound information and image information made from said second sound information are separated from each other and displayed.

13. The sound processing apparatus of claim 12, further comprising a selecting device and wherein the image information displayed on said display device is selected, whereby the sound information can be selected.

14. The sound processing apparatus of claim 12, wherein the predetermined time for detecting the frequency component is at least 0.3 second.

15. The sound processing apparatus of claim 12, further comprising a compressing device using a discrete cosine transformation device to compress the sound information and wherein said discrete cosine transformation device is used as said frequency detecting device.

16. The sound processing apparatus of claim 12, further comprising a time measuring device and wherein said time is recorded in said recording device, and said image information and said time are displayed on said display device.

17. The sound processing apparatus of claim 1, further comprising:

a frequency detecting device to detect the frequency component of said sound information within a predetermined time, wherein said converting device converts said sound information into image information corresponding to said frequency component, and wherein when the difference between the frequency component of first sound information recorded with the lapse of time and the frequency component of second sound information recorded thereafter is a predetermined value or greater, image information made from said first sound information and image information made from said second sound information are separated from each other and displayed.

18. The sound processing apparatus of claim 17, further comprising a selecting device and wherein the image information displayed on said display device is selected, whereby the sound information can be selected.

19. The sound processing apparatus of claim 17, wherein the predetermined time for detecting the frequency component is at least 0.3 second.

20. The sound processing apparatus of claim 17, further comprising a compressing device using a discrete cosine transformation device to compress the sound information and wherein said discrete cosine transformation device is used as said frequency detecting device.

21. The sound processing apparatus of claim 17, further comprising a time measuring device and wherein said time is recorded in said recording device, and said image information and said time are displayed on said display device.

22. The sound processing apparatus of claim 1, further comprising:

a frequency detecting device to detect the frequency component of said sound information within a predetermined time; and a sound-free portion detecting device to detect a sound-free portion in which there is no sound of a predetermined level or higher for a predetermined time or longer, wherein when the difference between the frequency component of first sound information recorded with the lapse of time and the frequency component of second sound information recorded thereafter is a predetermined value or greater, and when said sound-free portion is detected between said first sound information and said second sound information by said frequency detecting device, image information made from said first sound information and image information made from said second sound information are separated from each other and displayed.

23. The sound processing apparatus of claim 22, further comprising a selecting device and wherein the image information displayed on said display device is selected, whereby the sound information can be selected.

24. The sound processing apparatus of claim 22, wherein the predetermined time for detecting the frequency component is at least 0.3 second.

25. The sound processing apparatus of claim 22, further comprising a compressing device using a discrete cosine transformation device to compress the sound information and wherein said discrete cosine transformation device is used as said frequency detecting device.

26. The sound processing apparatus of claim 22, further comprising a time measuring device and wherein said time is recorded in said recording device, and said image information and said time are displayed.

27. The sound processing apparatus of claim 1, further comprising:

a frequency detecting device to detect the frequency component of said sound information within a predetermined time; and an output device to output sound information including a predetermined frequency component from among a plurality of bits of sound information recorded in said recording device.

28. The sound processing apparatus of claim 27, wherein the predetermined time for detecting the frequency component is at least 0.3 second.

29. The sound processing apparatus of claim 27, further comprising a compressing device using a discrete cosine transformation device to compress the sound information and wherein said discrete cosine transformation device is used as said frequency detecting device.

30. The sound processing apparatus of claim 1, comprising:

an image reproducing device to reproduce still image information; and a sound reproducing device to reproduce sound information corresponding to said still image information, wherein said still image information is displayed for a time necessary to reproduce the sound information corresponding to said still image information.

31. A sound processing apparatus comprising a sound information input device, a recording device to record said sound information, a frequency detecting device to detect the frequency component of said sound information within a predetermined time, a converting device to convert said sound information into first image information corresponding to said frequency component, an image pickup device to convert an object image into second image information, a compressing device to compress said second image information by the use of discrete cosine transformation, and an image recording device to record said compressed information, wherein said frequency detecting device uses the discrete cosine transformation.

32. A sound processing apparatus, comprising:

a sound information input device;

a recording device to record said sound information;

a display device;

a frequency detecting device to detect the frequency component of said sound information within a predetermined time;

a converting device to convert said sound information into image information corresponding to said frequency component; and a selecting device to select the image information displayed on said display device and to select the sound information displayed on said display device, wherein said image information is displayed on said display device in colors set in correspondence with a frequency.

* * * * *

UNITED STATES PATENT AND TRADEMARK OFFICE

CERTIFICATE OF CORRECTION

PATENT NO.: 5,974,386
DATED : October 26, 1999
INVENTOR(S): Satoshi Ejima, et al.

It is certified that error appears in the above-identified patent and that said Letters Patent is hereby corrected as shown below:

Title Page, [30] Foreign Application Priority Data, ADD
--Sept. 22, 1995 [JP] Japan 7 244222--.

Signed and Sealed this

Twenty-third Day of May, 2000

*Attest:*

Q. TODD DICKINSON

*Attesting Officer* *Director of Patents and Trademarks*